United States Patent [19]

Jang

[11] Patent Number: 6,075,734

[45] Date of Patent: Jun. 13, 2000

[54] INTEGRATED CIRCUIT MEMORY DEVICE FOR STORING A MULTI-BIT DATA AND A METHOD FOR READING STORED DATA IN THE SAME

[75] Inventor: Cheol-Ung Jang, Kyunggi-do, Rep. of Korea

[73] Assignee: Samsung Electronics Co., Ltd., Rep. of Korea

[21] Appl. No.: 09/213,616

[22] Filed: Dec. 17, 1998

[30] Foreign Application Priority Data

Dec. 29, 1997 [KR] Rep. of Korea ............... 97-77265

[51] Int. Cl.[7] .................................................. G11C 7/00
[52] U.S. Cl. ........................................ 365/203; 365/168
[58] Field of Search ............................ 365/203, 189.09, 365/230.06, 185.25, 204, 168

[56] References Cited

U.S. PATENT DOCUMENTS

| | | | |
|---|---|---|---|
| 5,550,772 | 8/1996 | Gill | 365/185.03 |
| 5,554,552 | 9/1996 | Chi | 437/43 |
| 5,563,828 | 10/1996 | Hasbun et al. | 365/185.33 |
| 5,566,125 | 10/1996 | Fazio et al. | 365/45 |
| 5,570,315 | 10/1996 | Tanaka et al. | 365/185.22 |
| 5,625,584 | 4/1997 | Uchino et al. | 365/45 |
| 5,703,814 | 12/1997 | Nishimura | 365/189.09 |
| 5,748,529 | 5/1998 | Lee | 365/185.17 |
| 5,748,536 | 5/1998 | Kwon et al. | 365/185.25 |
| 5,761,132 | 6/1998 | Kim | 365/189.05 |
| 5,768,188 | 6/1998 | Park et al. | 365/185.03 |
| 5,862,074 | 1/1999 | Park | 365/185.03 |

OTHER PUBLICATIONS

Bauer et al., "A Multilevel–Cell 32Mb Flash Memory", ISSC Digest of Technical Papers, IEEE International Solid–State Circuits Conference, Feb. 1995, pp. 132–133.

*Primary Examiner*—A. Zarabian
*Attorney, Agent, or Firm*—Myers Bigel Sibley & Sajovec

[57] ABSTRACT

Disclosed herein is an integrated circuit memory device which includes a memory cell arranged at an intersection of a word line and a bit line and a bit line precharge circuit for providing the bit line with a predetermined current during respective bit line precharge and sensing periods of time of a data reading operation in response to a bit line precharge signal. The integrated circuit memory device further includes a bit line pass transistor which has a gate and connected between the bit line precharge circuit and the bit line and which transfers the current from the bit line precharge circuit onto the bit line. Furthermore, the device includes a bias voltage supplying circuit which supplies the gate of the bit line pass transistor with a bias voltage during the data reading operation. In this embodiment, the bias voltage supplying circuit makes a voltage on the gate of the bit line pass transistor become discharged under the bias voltage during a bit line discharge period of time of the data reading operation.

9 Claims, 6 Drawing Sheets

(Prior Art)

INTEGRATED CIRCUIT MEMORY DEVICE FOR STORING A MULTI-BIT DATA AND A METHOD FOR READING STORED DATA IN THE SAME

FIELD OF THE INVENTION

The present invention relates to an integrated circuit memory device and, more particularly to an integrated circuit memory device for storing a multi-bit data and capable of preventing bit lines from being over-precharged during a bit line precharge period of time. And, the present invention relates to a method for reading stored data in the integrated circuit memory device.

BACKGROUND OF THE INVENTION

A memory cell array of, for example, a read-only memory (hereinafter, referred to as "ROM") comprises a plurality of memory cells arranged in plural rows and plural columns. Plural word lines extend along the rows of the memory cells, and plural bit lines extend along the columns of the memory cells. Each memory cell has its gate connected to a corresponding word line, its source grounded, and its drain connected to a corresponding bit line. To read data from an addressed (or a selected) memory cell, a bit line to which the addressed memory cell is connected is set a predetermined voltage, and a word line to which the addressed memory cell is connected is set at a word line voltage.

Generally, a memory cell of storing one-bit data has one transistor (or one cell transistor). A threshold voltage of the transistor is set at a high or low level so that the memory cell stores one-bit data. But, the memory cell can store one bit of data at a time. To store a great amount of data, the memory cell array needs to have more memory cells in proportion to the amount of data to be stored, causing its chip size to become large inevitably.

To manufacture an integrated circuit memory device which can store a large amount of data without increasing its chip size, it has recently been proposed that two bits of data can be stored in one memory cell. Such a memory cell is called "multi-level memory" or "multi-bit memory". Various types of multi-bit memories may be provided. In one type, the gate length or gate width of the transistor of each memory cell is changed so that the current flowing when the memory cell is selected may be set at various values. In another types, the dose of impurity ions injected into the MOS transistor of each memory cell is changed so that the threshold voltage of the MOS transistor may be set at various values. Thus, each memory cell of the multi-bit memory device can store two or more bits of data when set in two or more states. The multi-bit memory device has therefore its increased storage capacity.

Figure 1:
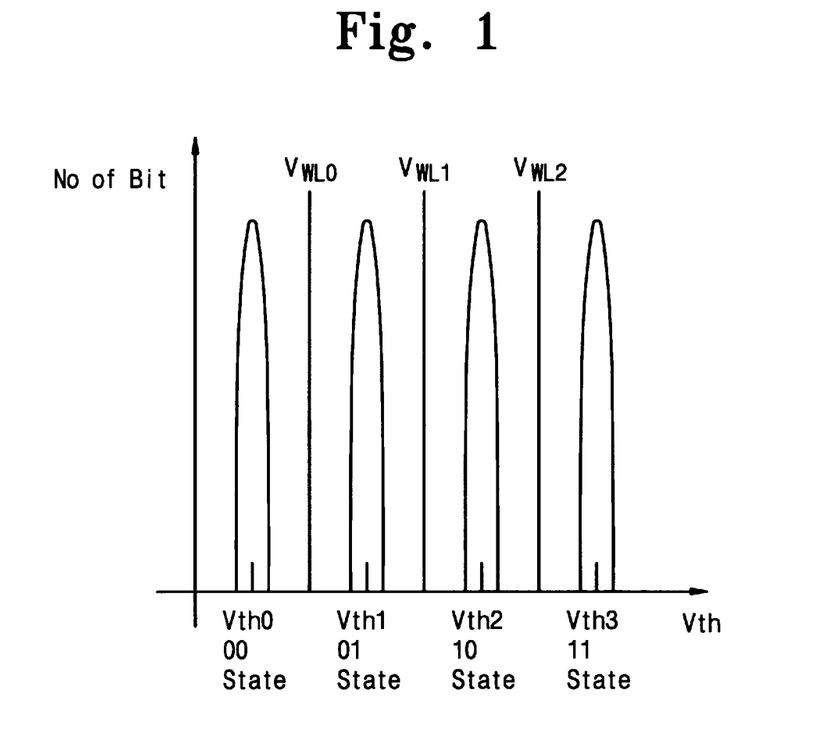
FIG. 1 is a diagram showing a relationship between word line voltages and threshold voltage distributions in accordance with multi-level data states in case that one memory cell stores two-bit data.

FIG. 1 shows a relationship between word line voltages and threshold voltage distributions in accordance with multi-bit data states in case that one memory cell stores two-bit data. Each memory cell of, for example, multi-bit ROM has one of four different threshold voltages Vth0 to Vth3. The threshold voltages Vth0 to Vth3 have the relationship of Vth0<Vth1<Vth2<Vth3. Any memory cell having a threshold voltage Vth0 will be identified as a memory cell M00, any memory cell having a threshold voltage Vth1 as a memory cell M01, any memory cell having a threshold voltage Vth2 as a memory cell M10, and any memory cell having a threshold voltage Vth3 as a memory cell M11. The memory cells M00, M01, M10 and M11 are assumed to store data "00", "01", "10" and "11", respectively.

Figure 2:
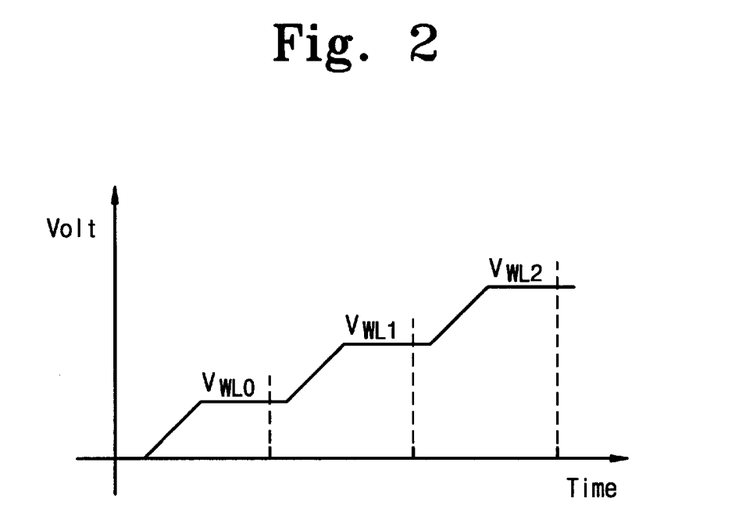
FIG. 2 is a diagram showing a voltage variation applied to a word line during a data reading operation.

FIG. 2 is a diagram showing a voltage variation applied to a word line during a data reading operation. With reference to FIGS. 1 and 2, a data reading operation of a memory cell of storing two bits of data will be described below.

Figure 5:
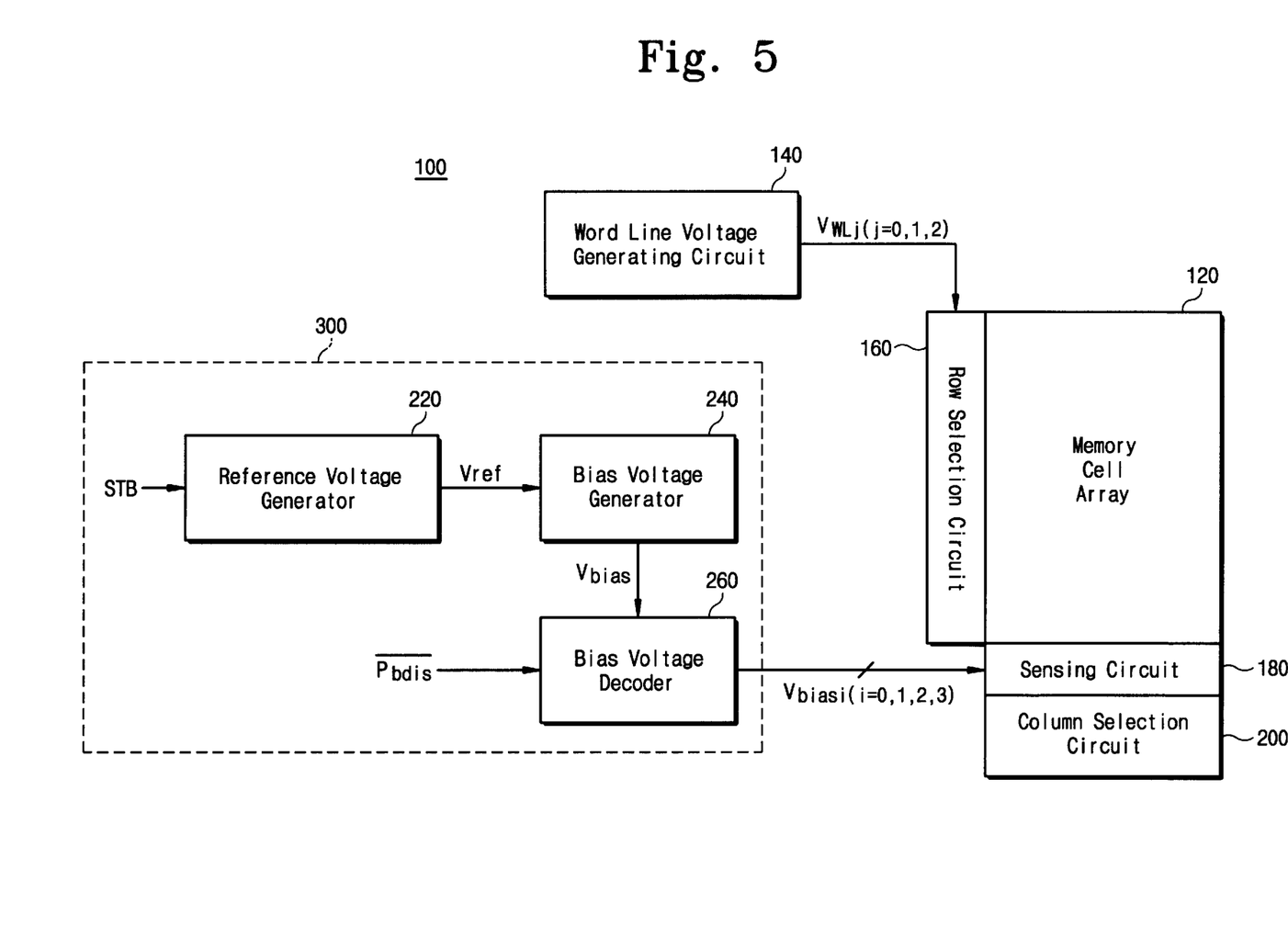
FIG. 5 is a block diagram showing an integrated circuit memory device according to the present invention.

First, a word line connected to a selected (or an addressed) memory cell of storing two-bit data is driven at a first word line voltage $V_{WL0}$, which has a middle voltage between Vth0 and Vth1, and then whether a current (or a cell current) flows through the selected memory cell is detected by a sensing circuit (180, refer to FIG. 5). And then, after a second word line voltage $V_{WL1}$ higher than the first word line voltage $V_{WL0}$ is applied to the word line, whether a cell current flows therethrough is checked thereby. Finally, a third word line voltage $V_{WL2}$ higher than the first and second word line voltages $V_{WL0}$ and $V_{WL1}$ is applied to the word line, and then whether a cell current flows therethrough is also detected thereby. As described above, in case that the selected memory cell stores two-bit data (that is, one of "00", "01", "10" and "11"), three sensing operations (or three read-out operations) are in turn performed by use of different word line voltages $V_{WL0}$, $V_{WL1}$ and $V_{WL2}$, and then results thus sensed are logically made up. By such a set of procedures as set forth above, the data reading operation has been finished.

Figure 3:
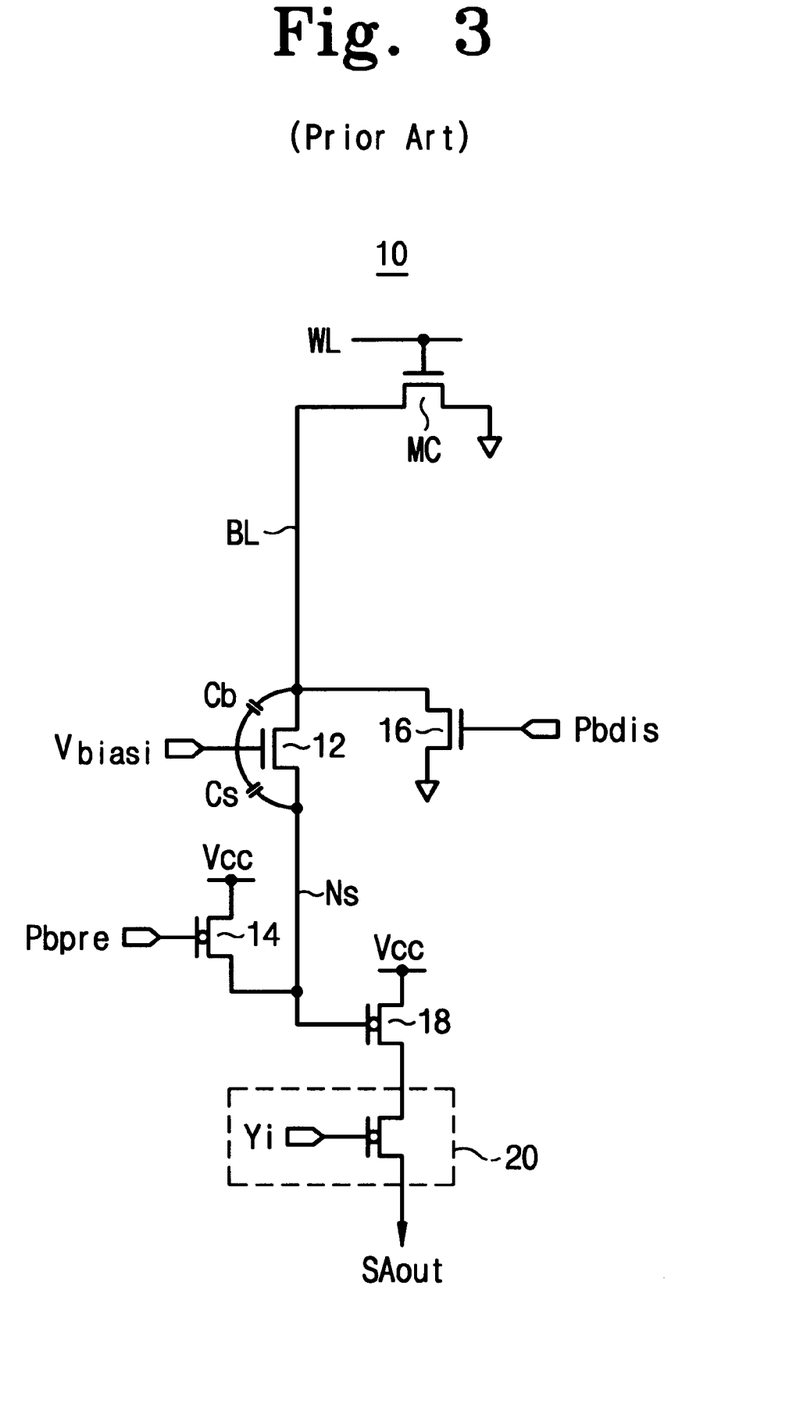
FIG. 3 is a circuit diagram showing a sensing structure of the prior art associated with one multi-bit memory cell in an integrated circuit memory device according to the prior art.
Figure 4:
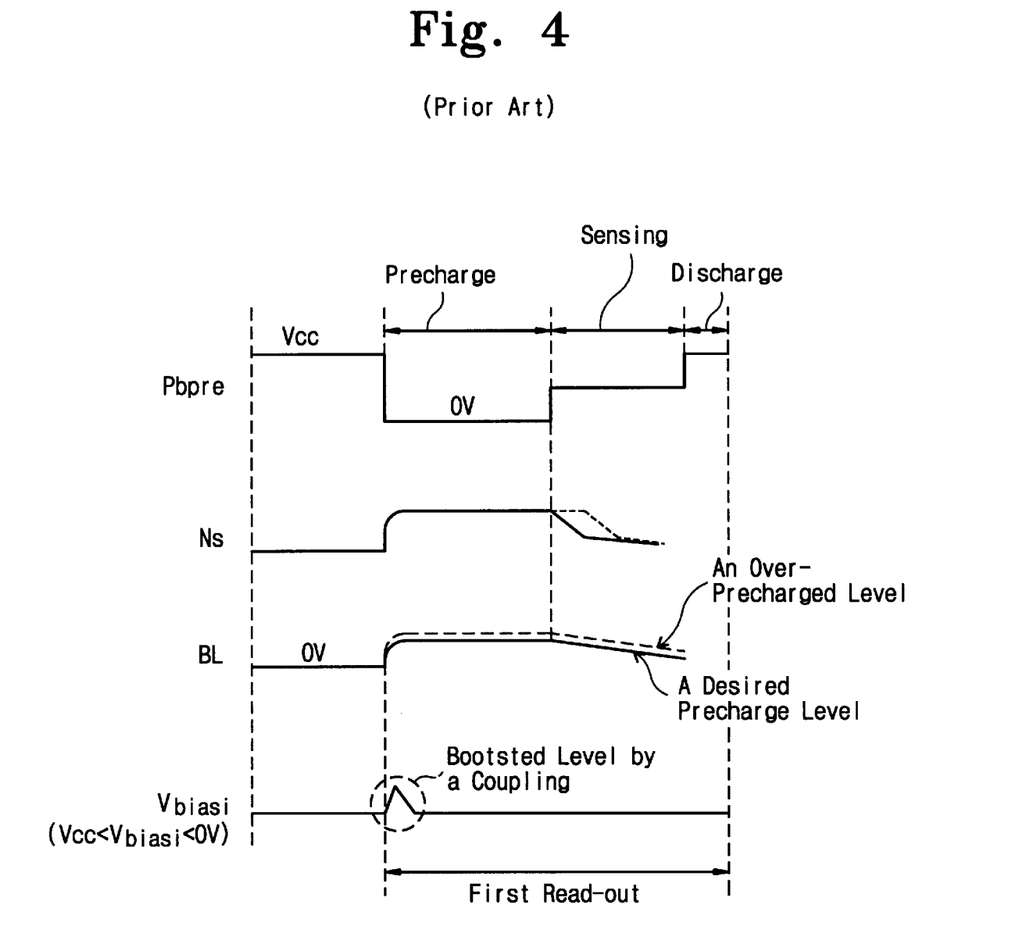
FIG. 4 is a timing diagram for describing a data reading operation according to the prior art.

FIG. 3 is a circuit diagram showing a sensing structure of the prior art associated with one multi-bit memory cell in an integrated circuit memory device 10 according to the prior art. The sensing structure of FIG. 3 is disclosed in U.S. Pat. No. 5,761,132 entitled "INTEGRATED CIRCUIT MEMORY DEVICES WITH LATCH-FREE PAGE BUFFERS THEREIN FOR PREVENTING READ FAILURES", and thus description thereof is omitted. FIG. 4 is a timing diagram for describing a data reading operation according to the prior art. A data reading operation of the integrated circuit memory device 10 will be described with reference to FIGS. 3 and 4.

As set forth above, the data reading operation is completed by performing three read-out operations sequentially. Each of the three read-out operations is performed according to a set of bit line precharge, sensing and discharge periods of time. Before a first read-out operation is performed, bit line precharge and discharge signals Pbpre and Pbdis remain at a high level (i.e., a power supply voltage Vcc level) and a bias voltage Vbiasi is at a predetermined voltage level between Vcc and 0V. This forces the bit line BL and a node Ns (hereinafter, referred to as "a sensing node") to be discharged at the ground voltage.

At a bit line precharge period of time of a first read-out operation, the signal Pbpre goes to a low level (i.e., the ground voltage level) from the high level, and the bias voltage Vbiasi continues to be maintained at the predetermined voltage level. This enables a bit line pass transistor 12 and a bit line precharge transistor 14 to be turned on, so that current from the turned-on transistor 14 is supplied through the bit line pass transistor 12 onto a bit line BL. That is, the bit line BL is precharged at a desired voltage (or a precharge voltage).

At a bit line sensing period of time of the first read-out operation, a voltage level of the signal Pbpre becomes transient between the high level and the low level, as known in FIG. 4. Current (or sensing current) from the bit line precharge transistor 14 switched on according to the signal Pbpre is supplied onto the bit line BL through the bit line pass transistor 12. A potential of the sensing node Ns is changed according to an "ON"/"OFF" state of the memory cell MC. The potential of the sensing node Ns thus changed (that is, read-out data) is inverted by a PMOS transistor 18, and is outputted through a column selection circuit 20.

Successively, at a bit line discharge period of time thereof, the signals Pbpre and Pbdis become the high level and the bias voltage Vbiasi continues to be maintained at the previous set voltage, so that the bit line BL and the sensing node Ns become discharged at the ground voltage. The first read-out operation has been completed by sequentially performing such a set of procedures as described above. Second and third read-out operations are performed equally to the first read-out operation, and description thereof is thus omitted.

When the bit line precharge operation is performed, however, a voltage on the gate of the bit line pass transistor 12 is boosted over the bias voltage Vbiasi in a moment at an initial period of time of the bit line precharge operation, as illustrated in FIG. 4. This is because the gate of the bit line pass transistor 12 is coupled both with the bit line BL (Cb in FIG. 3) and with the sensing node Ns (Cs in FIG. 3). Since the bias voltage Vbiasi becomes elevated over a desired voltage, the bit line BL is precharged over a desired voltage. In case that the memory cell MC is at the "ON" state during one of the read-out operations, a time in which the bit line BL and the sensing node Ns are developed is elongated, as illustrated by a dot line in FIG. 4. As a result, a sensing speed (or data reading speed) of the integrated circuit memory device 10 becomes dropped, and in a worst case, the data reading operation is failed. Accordingly, a reliability of the integrated circuit memory device 10 declines.

SUMMARY OF THE INVENTION

It is therefore an object of the present invention to provide an integrated circuit memory device capable of preventing bit lines from over-precharging during a bit line precharge period of time and a data reading method thereof.

It is another object of the invention to provide an integrated circuit memory device capable of reading data safely, so that a reliability thereof is improved.

In order to attain the above objects, according to an aspect of the present invention, there is provided an integrated circuit memory device which comprises a memory cell arranged at an intersection of a word line and a bit line and a bit line precharge circuit for providing the bit line with a predetermined current during respective bit line precharge and sensing periods of time of a data reading operation in response to a bit line precharge signal. The integrated circuit memory device further comprises a bit line pass transistor which has a gate and connected between the bit line precharge circuit and the bit line and which transfers the current from the bit line precharge circuit onto the bit line. Furthermore, the device comprises a bias voltage supplying circuit which supplies the gate of the bit line pass transistor with a bias voltage during the data reading operation. In this embodiment, the bias voltage supplying circuit makes a voltage on the gate of the bit line pass transistor become discharged under the bias voltage during a bit line discharge period of time of the data reading operation, so that the bit line is not boosted over the bias voltage at a start of the bit line precharge period of time.

Although the integrated circuit memory device according to the present invention is limited to a mask ROM storing multi-bit data as an exemplary preferred embodiment, it is to be understood that the scope of the present invention is not limited to the mask ROM. The integrated circuit memory device comprises an electrically erasable programmable read only memory (EEPROM), a flash EEPROM, EPROM, etc., each of which stores multi-bit data. Furthermore, it is obvious to ones skilled in the art that the integrated circuit memory device can be applied to memory devices, each of which can store a single bit of data.

DESCRIPTION OF THE PREFERRED EMBODIMENTS

A preferred embodiment according to the present invention will be explained with reference to the accompanying drawings.

We should give attention to the fact that a bias voltage supplying circuit 300 provides the gate of each bit line pass transistor 181 in a sensing circuit 180 with a bias voltage Vbias only when bit line precharge and sensing periods of time of each read-out operation are performed. That is, the bias voltage supplying circuit 300 does not provide the bias voltage Vbias into the gates thereof during a bit line discharge period of time, preventing the gates thereof from being boosted over the bias voltage Vbias at a start of the bit line precharge period of time of a succeeding read-out operation. This causes each bit line to be not over-precharged during the bit line precharge period of time, securing a data reading operation in the integrated circuit memory device.

FIG. 5 is a block diagram showing an integrated circuit memory device 100 according to the present invention.

In the integrated circuit memory device 100, there is provided a memory cell array 120, although not shown in the drawing, which has plural word lines, plural bit lines and plural memory cells arranged in intersections of the word lines and the bit lines. The memory cells store a multi-bit data and have one of plural threshold voltages corresponding to possible states of the multi-bit data, respectively. A word line voltage generating circuit 140 generates a word line voltage $V_{WLi}$ (i=0, 1, 2) of different levels during a data reading operation. An example of the circuit 140 is disclosed in U.S. Pat. No. 5,457,650 (entitled "APPARATUS AND METHOD FOR READING MULTI-BIT DATA STORED IN A SEMICONDUCTOR MEMORY"), and description thereof is thus omitted.

A row selection circuit 160 selects at least one of the word lines and provides the word voltage $V_{WLi}$ with the selected word line. The circuit 160 forces the unselected word lines into the ground voltage (that is, 0 volts). Data stored in memory cells of both the selected word line and bit lines is sensed through a sensing circuit 180, and data thus sensed is outputted through a column selection circuit 200 according to an input/output organization.

As shown in FIG. 5, a bias voltage supplying circuit 300, which provides the sensing circuit 180 with a bias voltage Vbiasi (i=0, 1, 2, 3) of, for example, about 2.3 volts, is comprised of a reference voltage generator 220, a bias voltage generator 240, and a bias voltage decoder 260. The reference voltage generator 220 responds to a signal STB indicating device operation and standby state, and then generates a reference voltage Vref when the signal STB becomes the low level as an activated state. And, the bias voltage generator 240 is enabled when the reference voltage is set at a desired voltage level, and then produces a bias voltage Vbias of about 2.3 volts.

The bias voltage decoder 260 receives the bias voltage Vbias from the bias voltage generator 240 and outputs one selected from bias voltages Vbiasi (i=0, 1, 2, 3) in response to a complementary signal $\overline{Pbdis}$ of a bit line discharge signal Pbdis indicating a bit line discharge period of time. That is, when the complementary signal $\overline{Pbdis}$ is at the low level (when bit line discharge operation is performed), no bias voltage is outputted from the bias voltage decoder 260. When the signal $\overline{Pbdis}$ is at the high level (when the bit line precharge and sensing operations are performed), a selected bias voltage Vbiasi is provided into the sensing circuit 180.

Figure 6:
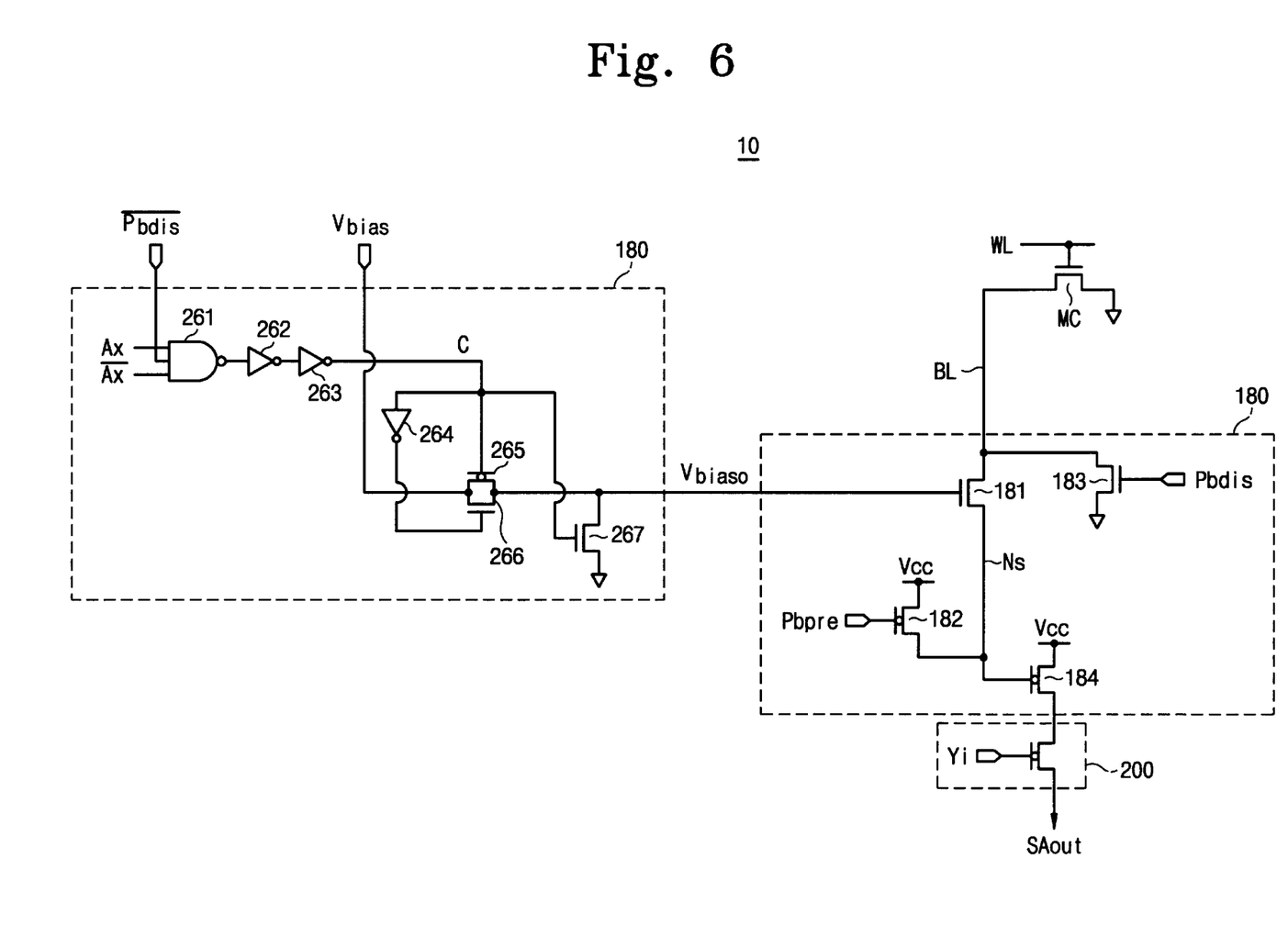
FIG. 6 is a detailed circuit diagram showing a bias voltage decoder circuit according to a preferred embodiment of the present invention.

In this embodiment, 512 bit lines are provided in the memory cell array 120. The 512 bit lines are divided into 16 segments, each of which is composed of 4 units. That is, one unit is comprised of 8 bit lines. Such a bit line architecture is to solve a power issue induced when bias voltage is simultaneously applied to bit line pass transistors (to be described hereinbelow) in the sensing circuit 180 and corresponding to the 512 bit lines, respectively. In accordance with this bit line structure, the bit line pass transistors corresponding to one unit are supplied with the bias voltage from the bias voltage decoder 260, and no bias voltage is provided into the bit line pass transistors corresponding to the rest of the units. Under this condition, the bias voltage decoder 260 of the present invention to satisfy such a requirement as described above is illustrated in FIG. 6 with reference to one memory cell and the sensing circuit 180 corresponding to the memory cell. In FIG. 6, the constituent elements of the sensing circuit 180 are identical to those in the prior art of FIG. 3, and description thereof is thus omitted.

Referring to FIG. 6, the bias voltage decoder 260 is composed of one NAND gate 261, three invertors 262, 263 and 264, a PMOS transistor 265, and two NMOS transistors 266 and 267. The NAND gate 261 and two invertors 262 and 263 act as a logic circuit, and the invertor 264 and the PMOS and NMOS transistors 265 and 266 serve as a transfer circuit so that a bias voltage Vbias0 corresponding to one unit is outputted. The logic circuit outputs a signal C according to selection signals Ax and $\overline{Ax}$ when the complementary signal $\overline{Pbdis}$ is at the high level (when the bit line precharge and sensing operations are performed). When the selection signals Ax and $\overline{Ax}$ corresponding to one selected unit are enabled, the signal C becomes the low level during bit line precharge and sensing periods of time. This enables the bias voltage Vbias from the bias voltage generator 240 to be transferred through the transfer circuit (264, 265, and 266) onto the gate of the bit line pass transistor 181 in the sensing circuit 180. Although not illustrated in FIG. 6, it is obvious to ones skilled to the art that the constituent elements corresponding to the rest of the units are configured such as illustrated in FIG. 6.

On the contrary, the signal C becomes the high level when the complementary signal $\overline{Pbdis}$ is at the low level (when the bit line discharge operation is performed), even though the selection signals Ax and $\overline{Ax}$ are enabled. This enables the bias voltage Vbias from the bias voltage generator 240 to be not transferred through the transfer circuit (264, 265, and 266) onto the gate of the bit line pass transistor 181. As a result, the gate of the bit line pass transistor 181 in the sensing circuit 180 is grounded through the NMOS transistor 267 (acting as a discharge transistor) in the bias voltage decoder 260.

Figure 7:
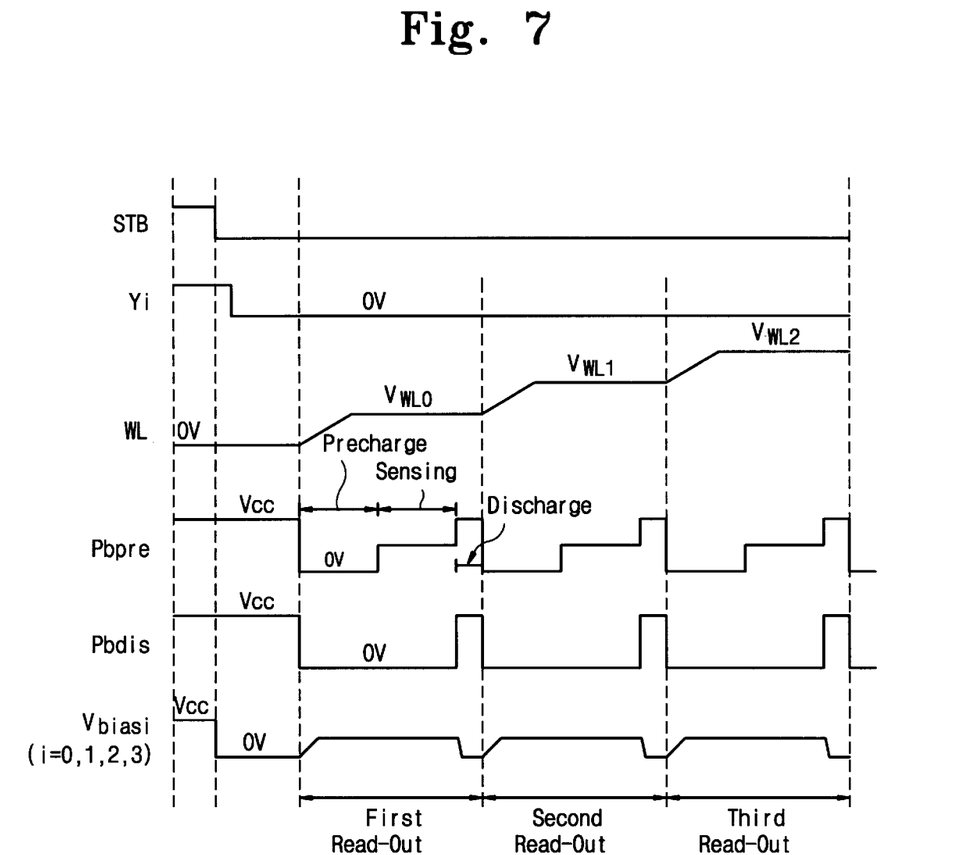
FIG. 7 is a timing diagram for explaining a data reading operation according to the present invention.

FIG. 7 is a timing diagram for describing a data reading operation according to the present invention. A data reading operation of the integrated circuit memory device 100 will be described with reference to the accompanying drawings.

As set forth above, reading two bits of data is finished by performing three read-out operations, each of which is composed of a set of a bit line precharge period of time, a bit line sensing period of time and a bit line discharge period of time.

First, as the signal STB becomes transient from the high level to the low level, the reference voltage generator 220 produces a reference voltage Vref, and then the bias voltage generator 240 generates the bias voltage Vbias of, for example, about 2.3 volts using the reference voltage Vref. The bias voltage Vbias thus produced is provided into the bias voltage decoder 260. However, as illustrated in FIG. 7, the bit line discharge and precharge signals Pbdis and Pbpre are maintained at the high level before a first read-out operation, so that no bias voltage Vbias from the bias voltage generator 240 is transferred onto the gate of the bit line pass transistor 181. This is because the PMOS and NMOS transistors 265 and 266 constituting the transfer circuit are turned off according to the complementary signal $\overline{Pbdis}$ of the low level regardless of selection signals Ax and $\overline{Ax}$. At this time, gate potential of the bit line pass transistor 181 is becoming maintained at the ground voltage (0 volts) through the discharge transistor 267, and the bit line BL associated with the selected memory cell MC becomes discharged through the bit line discharge transistor 183 in the sensing circuit 180 at the low level.

And then, an actual read-out operation is started. At the bit line precharge period of time of a first read-out operation, the bit line precharge signal Pbpre goes to the low level from the high level, so that the bit line precharge transistor 182 is turned on and the sensing node Ns starts to be charged through the turned-on transistor 182. At the same time, since the bit line discharge signal Pbdis becomes the low level (that is, the complementary signal $\overline{Pbdis}$ becomes the high level), the gate potential of the bit line pass transistor 181 becomes pulled up from the low level to the bias voltage Vbias0 of about 2.3 volts, as known in FIG. 7 (it means that the bit line pass transistor 181 is turned on). Accordingly, the bit line BL associated with the selected memory cell MC is precharged through the bit line pass transistor 181 thus turned on.

In this embodiment, it can be seen that the gate potential of the bit line pass transistor 181 is not boosted over the bias voltage Vbias0 at a start of the bit line precharge period of time because the bias voltage Vbias is becoming set from the low level. In other words, although the gate potential thereof is boosted owing to couplings both between the gate and the bit line BL and between the gate and the sensing node Ns, the gate potential thereof does not go beyond the bias voltage Vbias level.

At the bit line sensing period of time of the first read-out operation, the bit line precharge signal Pbpre level is changed between the high level and the low level, as known in FIG. 7. Current (or sensing current) from the bit line precharge transistor 182 switched on according to the signal Pbpre is supplied onto the bit line BL through the bit line pass transistor 181. A potential of the sensing node Ns can be changed according to an "ON"/"OFF" state of the memory cell MC. The potential of the sensing node Ns thus changed (that is, read-out data) is inverted by a PMOS transistor 184, and then is outputted through the column selection circuit 200.

Finally, at a bit line discharge period of time, the bit line precharge and discharge signals Pbpre and Pbdis all become the high level, so that the bias voltage Vbias0 becomes the low level by the same manner as explained above, and the bit line BL is discharged at the low level for a second succeeding read-out operation. The first read-out operation has been completed by sequentially performing such a set of procedures as described above. Second and third succeeding read-out operations are performed equally to the first read-out operation, and description thereof is thus omitted.

According to the present invention, gates of bit line pass transistors 181 in the sensing circuit 180 are discharged at a voltage less than the bias voltage Vbias, that is, the ground voltage, during the bit line discharge period of time of each read-out operation. This enables the gates thereof to be not boosted over the bias voltage Vbias at the initial period of time of each read-out operation, even though the gates thereof are coupled both with the bit line BL (Cb, refer to FIG. 3) and with the sensing node Ns (Cs, refer to FIG. 3). Therefore, there can be prevented bit line over-precharge phenomenon induced when the gate potential of the bit line pass transistor 181 is boosted over the bias voltage Vbias. As a result, there can be prevented a sensing speed (or data reading speed) of the integrated circuit memory device 100 from becoming dropped, and a reliability of the integrated circuit memory device can be improved.

The present invention has been described using an exemplary preferred embodiment. However, it is to be understood that the scope of the present invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A multi-bit integrated circuit memory device comprising:
    a word line;
    a bit line;
    a memory cell arranged at an intersection of the word line and the bit line;
    a bit line precharge circuit responsive to a bit line precharge signal, for providing the bit line with a predetermined current during respective bit line precharge and sensing periods of a multi-bit data read operation;
    a bit line pass transistor having a gate and connected between the bit line precharge circuit and the bit line, for transferring the current from the bit line precharge circuit onto the bit line; and
    a bias voltage supplying circuit for supplying the gate of the bit line pass transistor with a bias voltage during the data reading operation, wherein the bias voltage supplying circuit reduces a voltage level on the gate of the bit line pass transistor during a bit line discharge period of a read-out interval of a multi-bit read operation.

2. The integrated circuit memory device according to claim 1, wherein said memory cell is capable of storing a multi-bit data.

3. The integrated circuit memory device according to claim 1, wherein said bias voltage is between a power supply voltage and a ground voltage.

4. The integrated circuit memory device according to claim 1, further comprising a bit line discharge transistor connected between the bit line and a ground voltage and switched on/off according to a bit line discharge signal indicating the bit line discharge period of time.

5. The integrated circuit memory device according to claim 4, wherein said bias voltage supplying circuit comprises:
    a transfer circuit for transferring the bias voltage onto the gate of the bit line pass transistor during the precharge and sensing periods of time; and
    an NMOS transistor for discharging the gate of the bit line pass transistor at the ground voltage during the bit line discharge period of time, wherein the NMOS transistor is connected between the gate of the bit line pass transistor and the ground voltage and is switched on/off according to the complementary signal of the bit line discharge signal.

6. A method for reading stored data from a memory cell in a multi-bit integrated circuit memory device comprising the memory cell arranged at an intersection of a word line and a bit line and a bit line pass transistor for transferring current to be supplied onto the bit line during a multi-bit data read operation, the method comprising the steps of:
    precharging the bit line at a bit line precharge voltage level during a first read-out operation of the multi-bit read operation;
    reading out stored data in the memory cell through the bit line; and then
    reducing a voltage level at a gate of the bit line pass transistor during a bit line discharge period of a second read-out interval of a multi-bit read operation.

7. The method according to claim 6, wherein the gate of the bit line pass transistor becomes grounded during the discharging step.

8. The integrated circuit of claim 1, wherein said bit line precharge signal is about a ground voltage level during the bit line precharge period, and is in a range between the ground voltage level and a power supply voltage level during the bit line sensing period, and is about the power supply voltage level during the bit line discharge period.

9. A multi-bit integrated circuit memory device comprising:
    a word line;
    a bit line;
    a memory cell arranged at an intersection of the word line and the bit line;
    a bit line precharge circuit responsive to a bit line precharge signal, that provides current to the bit line during respective bit line precharge and sensing periods of a multi-bit read operation;
    a bit line pass transistor having a gate and connected between the bit line precharge circuit and the bit line; and
    a bias voltage supplying circuit coupled to the gate of the bit line pass transistor that supplies a bias voltage thereto during the data reading operation, wherein the bias voltage supplying circuit reduces a voltage level on the gate of the bit line pass transistor during a bit line discharge period of a read-out interval of a multi-bit read operation.

* * * * *